(12) United States Patent
Smith et al.

(10) Patent No.: US 7,598,006 B1
(45) Date of Patent: Oct. 6, 2009

(54) METHOD AND APPARATUS FOR EMBEDDED ENCODING OF OVERLAY DATA ORDERING IN AN IN-SITU INTERFEROMETER

(75) Inventors: Adlai H. Smith, Escondido, CA (US); Robert O. Hunter, Jr., Snowmass Village, CO (US); Joseph J. Bendik, Jr., Escondido, CA (US)

(73) Assignee: Litel Instruments, San Diego, CA (US)

( * ) Notice: Subject to any disclaimer, the term of this patent is extended or adjusted under 35 U.S.C. 154(b) by 669 days.

(21) Appl. No.: 11/298,129

(22) Filed: Dec. 8, 2005

Related U.S. Application Data

(60) Provisional application No. 60/634,791, filed on Dec. 8, 2004.

(51) Int. Cl.
*G03F 9/00* (2006.01)
(52) U.S. Cl. .............................. 430/5; 430/22; 430/30; 716/19; 716/21
(58) Field of Classification Search .................... 430/5, 430/22, 30; 716/19, 20, 21
See application file for complete search history.

(56) References Cited

U.S. PATENT DOCUMENTS

| 5,828,455 | A | 10/1998 | Smith et al. |
| 5,978,085 | A | 11/1999 | Smith et al. |
| 6,573,986 | B2 | 6/2003 | Smith et al. |
| 6,693,390 | B2 | 2/2004 | Tamai et al. |
| 6,833,221 | B2 | 12/2004 | McArthur et al. |
| 6,906,303 | B1 | 6/2005 | Smith |
| 6,906,780 | B1 | 6/2005 | Smith |
| 2002/0140917 | A1* | 10/2002 | McArthur et al. ............. 355/53 |
| 2005/0243309 | A1 | 11/2005 | Smith et al. |

OTHER PUBLICATIONS

KLA-Tencor, "KLA 5200 Overlay Brochure".
Bio-Rad Semiconductor Systems, "Quaestor Q7 Brochure".
KLA-Tencor, "KLA Archer 10 Brochure", www.kla-tencor.com.
N. Sullivan, "Semiconductor Pattern Overlay", Proc. of SPIE, Critical Reviews, vol. CR52, pp. 160-188.
W. Press et al., "Numerical Recipes, The Art of Scientific Computing", Cambridge University Press, pp. 52-64, 1990.

* cited by examiner

*Primary Examiner*—Christopher G Young

(57) ABSTRACT

A method and apparatus for embedded encoding of overlay data ordering in an in-situ interferometer is described. An in-situ interferometer is encoded, or augmented, with special or missing alignment attributes at desired positions. Exposing a sequence of the encoded in-situ interferometer onto a silicon wafer coated with a suitable recording media. Then measuring the alignment attributes. The encoded overlay data is processed to verify the proper order and physical location of each overlay measurement. The data is collected without increasing the overall number of required overlay measurements required. Collection of overlay data allows for the proper reconstruction of the aberrated wavefront. Non-coupling alignment attribute offsets can also be used to perform similar operations using singular value decomposition and null space operations.

7 Claims, 14 Drawing Sheets

METHOD AND APPARATUS FOR EMBEDDED ENCODING OF OVERLAY DATA ORDERING IN AN IN-SITU INTERFEROMETER

REFERENCE TO RELATED APPLICATION

This application claims priority benefit of U.S. provisional Application Ser. No. 60/634,791 filed Dec. 8, 2004 entitled "Method and Apparatus for Embedded Encoding of Overlay Data Ordering in an In-Situ Interferometer" by Smith et al. Priority of the filing date of the prior application is hereby claimed, and the disclosure of the prior application is hereby incorporated by reference in its entirety.

BACKGROUND

1. Field

The present invention relates generally to optical metrology and, more particularly, to photolithography used in semiconductor manufacturing.

2. Description of the Related Art

Over the past thirty years the microelectronics industry has experienced dramatic rapid decreases in critical dimension by moving constantly improving photolithographic imaging systems. Today, these photolithographic systems are pushed to performance limits. As the semiconductor industry rapidly approaches limits of optical lithography, new metrology techniques will be required to measure the integrity of the photolithographic exposure machines and the devices they help produce. Specifically, metrology techniques that can accurately determine the aberrations of the projection system as well as the alignment precision of the exposure machines will be a necessity. In addition, these new metrology techniques will require advances in the methods used to guarantee the integrity of the collected data.

Conventional techniques for collecting overlay data includes programming an overlay tool with a set of software instructions that instructs the overlay tool to measure the alignment attributes (such as, bar-in-bar, box-in-box, and others) in a distinct order. The labeling and identification of the overlay output data usually depends on the type of overlay tool used to measure the alignment attributes. For example, the KLA 5200 series tools (see, for example, KLA-Tencor, "KLA 5200 Overlay Brochure") use a complicated coding system that requires a fair degree of interpretation to decode the output data. Other tools, like the BioRad Q7 (see, for example, Bio-Rad Semiconductor Systems, "Quaestor Q7 Brochure"), simply label the output data, matching each registration error to its unique field point. However, it is important to consider that most overlay tools are programmed to measure the overlay or registration error of identical target structures that are located in close proximity of one another. Most overlay tools use an optical recognition routine to identify each alignment attribute before each measurement. Oftentimes the optical recognition system can read the wrong alignment attribute or a similar looking feature in a systematic way. If one simply assumes that the overlay tool has identified the correct alignment attribute and proceeds to use the program for production measurements, the data can become corrupt. In addition, many times the alignment attributes and wafer exposure patterns are symmetric with respect to the notch of the wafer, and simple rotations of the wafer can cause a good deal of confusion when trying to verify the results visually. Therefore, in some cases, even if the output data is labeled correctly there is really no way to independently verify the integrity of the results for common machine and overlay tool programming errors.

Recently, extrinsic, or non-embedded, techniques for verifying overlay data orientation have been developed (see, for example, McArthur et al., "Method and Apparatus for Proper Ordering of Registration Data", U.S. Pat. No. 6,833,221, Dec. 21, 2004). While these extrinsic techniques are useful they require that the user actually perform additional exposures and measurements. These additional exposures and measurements can be troublesome for semiconductor manufacturing facilities that limit excess metrology.

Thus, a need exists for improved methods and apparatus that can independently verify the integrity of an overlay set-up program and output data results before using the job deck programs for production applications. It is also desirable to minimize data collection during verification of the overlay set-up program.

SUMMARY

Embodiments disclosed herein address the above stated need of verifying the integrity of an overlay set-up program. Aspects include embedded encoding that is inherent to a projected field point (PFP), measurements that cannot be omitted by the user, and a verification process that is carried out in software, invisible to the user, at each and every measured field point.

A method and apparatus for embedded encoding of overlay data ordering in an in-situ interferometer is described. An in-situ interferometer is encoded or augmented with missing alignment attributes, either aberration determining structures (MA) or reference structures (MO) at desired locations. Following an exposure sequence of the encoded in-situ interferometer onto a silicon wafer coated with a suitable recording media the alignment attributes are measured using a conventional overlay reader and job deck. The encoded overlay data is processed with appropriate software to verify both the proper order and physical location of each overlay measurement without increasing the overall number of required overlay measurements as required by Smith et al. "Apparatus, Method of Measurement and Method of Data Analysis for Correction of Optical System, U.S. Pat. No. 5,978,085, Nov. 2, 1999. Alternate embodiments make use of non-coupled offsets and changes in the physical size (width) of overlay alignment attributes.

In one embodiment, encoded patterns within a projected field point can be used to partially or completely verify the ordering and physical orientation of overlay data gathered for the purposes of in-situ interferometry as practiced according to see, for example, Smith et al., "In-Situ Interferometer Arrangement", U.S. Pat. No. 6,693,390, Nov. 8, 2005, and Smith et al., "Apparatus, Method of Measurement and Method of Data Analysis for Correction of Optical System", U.S. Pat. No. 5,828,455, Oct. 27, 1998, and U.S. Pat. No. 5,978,085, supra. The process of creating In-Situ Interferometer (ISI) reticles, including appropriately modified physical structures (modified MAs and MOs—see, for example, U.S. Pat. No. 6,833,221 supra), and using overlay data gathered to verify the physical location where the overlay data was gathered, is called embedded encoding. Embedded at each projected field point (PFP) is additional information describing relative spatial arrangement of physical structures (MAs and MOs). Extracting the additional information requires no additional overlay measurements; hence the adjective embedded. This is an improvement over extrinsic or non-embedded techniques for verifying overlay data orientation (see, for example, U.S. Pat. No. 6,833,221 supra) that do require additional overlay measurements which may be troublesome for semiconductor manufacturing facilities that limit excess metrology. Aspects of embedded encoding include that the information is inherent to the projected field point (PFP), the measurements cannot be omitted by the user, and the verification process is carried out in software, invisible to the user, at each and every measured field point.

In one embodiment of embedded encoding of overlay data ordering a reticle pattern is exposed onto a substrate with a recording media. The reticle includes a plurality of alignment attributes, wherein the plurality of alignment attributes include an array of aberration determining structures and an array plurality of reference structures. On the reticle, one or more of the alignment attributes at predetermined sites are removed. After exposure, the reticle pattern is measured. Then it is determined if measurements indicating missing alignment attributes within the exposed reticle pattern correlate to the predetermined sites of the reticle. The removed alignment attributes can be an aberration determining structure, or a reference structure, or both.

The substrate can be a semiconductor surface, a silicon wafer, a flat panel display, a reticle, a photolithographic mask, or an electronic recording media. The recording media can be a negative resist material, a positive resist material, an electronic CCD, a liquid crystal material, or an optically sensitive material. Also, the alignment attributes comprise a box-in-box structure, a bar-in-bar structure, or a grating. Additionally, the techniques can be used in a photolithographic stepper system, a photolithographic scanner system, a one dimensional scanner, a two dimensional scanner, an electronic beam imaging system, an extreme ultra-violet photolithographic tool, an EPL machine, or an image side immersion lens, or an x-ray imaging system. Examples of alignment attributes comprise a box-in-box structure, a bar-in-bar structure, or a grating. The method can also include interpolating the measurements indicating missing alignment attributes for reconstructing a lens aberration.

In another embodiment a reticle includes an array of aberration determining structures and an array of reference structures. At least one of the aberration determining structures at a predetermined location with the array of aberration structures is removed. The aberration determining structures can be an inner box structure and the reference structures comprise an outer box structure. Also, the aberration determining structures comprise an inner bar structure and the reference structures comprise an outer bar structure.

In another embodiment a reticle includes an array of aberration determining structures and an array of reference structures. At least one of the reference structures at a predetermined location with the array of reference structures is removed. The aberration determining structures can be an inner box structure and the reference structures comprise an outer box structure. Also, the aberration determining structures comprise an inner bar structure and the reference structures comprise an outer bar structure.

In another embodiment of embedded encoding of overlay data ordering a reticle pattern is exposed onto a substrate with a recording media, wherein the reticle includes a plurality of separate and distinguishable alignment attributes and a desired number of the alignment attributes at desired locations are shifted with non-coupling offsets. The exposed reticle pattern is measured. Then determining the non-coupled portion of the overlay data and reticle error and correlating known overlay data with known non-coupling offsets to determine a statistical integrity. It can then be determined if the statistical integrity is above a threshold. Also, the non-coupled offsets can be derived from shifts representing pupil decentering or telecentricity. And, the non-coupled offsets can include one or more vortices. In addition, reconstructing a wavefront, or a wafer-side telecentricity can be performed.

In another embodiment, a reticle includes an array of aberration determining structures and an array of reference structures. At least one of the reference structures at a predetermined location with the array of reference structures is offset with a non-coupled offset pattern.

In still another embodiment a reticle includes an array of aberration determining structures and an array of reference structures. At least one of the aberration determining structures at a predetermined location with the array of aberration determining structures is offset with a non-coupled offset pattern.

Another embodiment of embedded encoding of overlay data ordering includes exposing a reticle pattern onto a substrate with a recording media, the reticle comprising a plurality of alignment attributes. The plurality of alignment attributes include an array of aberration determining structures and an array plurality of reference structures wherein one or more of the alignment attributes at predetermined sites on the reticle are modified. Then measuring the exposed reticle pattern and determining if measurements indicating modified alignment attributes within the exposed reticle pattern correlate to the predetermined sites of the reticle. The modification of the alignment attribute includes changing the width of the alignment attribute. The alignment attribute that is modified can be an aberration determining structure, or a reference structure or both.

Still another embodiment of embedded encoding of overlay data ordering includes exposing a first reticle pattern in a first position onto a substrate with a recording media. The reticle includes a plurality of alignment attributes, wherein the plurality of alignment attributes that include an array of aberration determining structures and an array plurality of reference structures. One or more of the alignment attributes at predetermined sites on the reticle are removed. Then exposing a second reticle pattern onto the substrate, wherein the second exposure has been shifted in a desired amount so that aberration determining structures in the second pattern overlay references structures in the first exposure. Measuring the exposed reticle patterns and determining if measurements indicating missing alignment attributes within the exposed reticle pattern correlate to the predetermined sites of the reticle. The removed alignment attribute comprises an aberration determining structure, or a reference structure, or both.

Other features and advantages of the present invention should be apparent from the following description of exemplary embodiments, which illustrate, by way of example, aspects of the invention.

DETAILED DESCRIPTION

The word "exemplary" is used herein to mean "serving as an example, instance, or illustration." Embodiments described herein are "exemplary" and are not necessarily to be construed as preferred or advantageous over other embodiments.

In U.S. Pat. No. 5,828,455 supra and U.S. Pat. No. 5,978,085 supra, a method of providing in-situ measurement of lens aberration and other parameters is described. One method requires the ordered reading of box-in-box (alignment attributes) overlay targets by means of an optical overlay tool. Such tools, as developed for wafer inspection in semiconductor manufacturing facilities, entail creating a job deck program to parse, order and measure the overlay targets. Additionally, almost all job deck programs have no immediately apparent means of independently verifying if the overlay data has been read in the correct order. For example, as mentioned in U.S. Pat. No. 5,828,455 supra the results of the reconstructed wavefront depends on knowing exactly what overlay measurement is associated with what position both in terms of field point, as well as within a field point array. Since the programming of such optical overlay tools is sensitive to many parameters, such as desired measurement spacing (pitch), the feature size, the field point desired, and other such parameters, it is very difficult to determine if an overlay tool is properly programmed for such an application. This is aggravated by the fact that the reconstructed wavefront does not lend itself to an intuitive understanding of what the local overlay should look like. Thus, to provide an independent verification of the program and operation of overlay tools for applications sensitive to such kinds of errors, a means of independently determining the programming and functioning of the overlay tool has been invented. In general, as techniques requiring known ordered data reading using existing tools are developed, the following invention will become a key factor to their proper functioning.

First Embodiment

Missing Teeth

Figure 6:
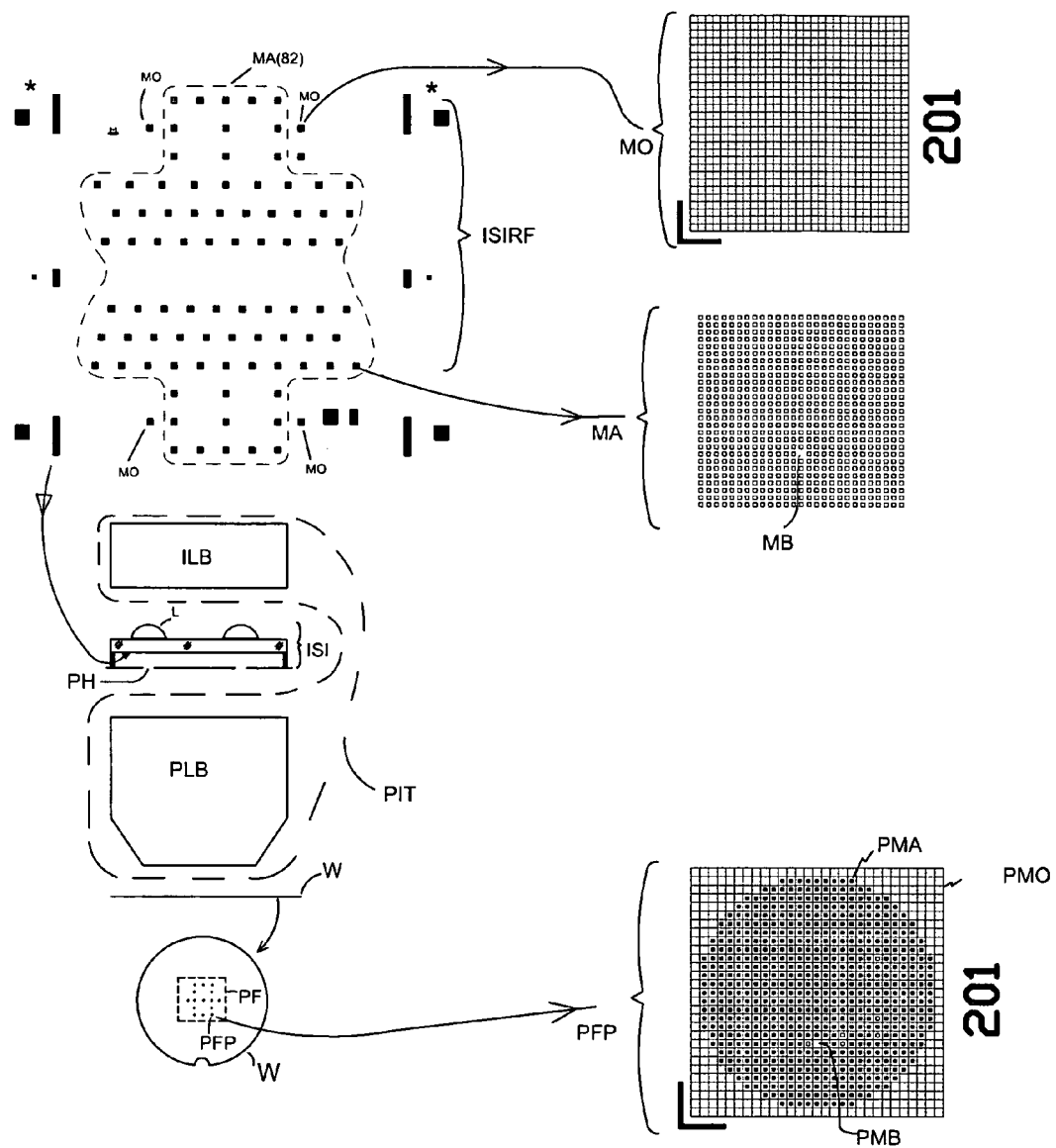
FIG. 6 shows a schematic of operation and illustration for in-situ interferometers.

FIG. 6 shows a schematic of operation and illustration for in-situ interferometers. An example of an in-situ interferometer is detailed in U.S. Pat. No. 5,978,085 supra. The In-Situ Interferometer, (ISI) according to U.S. Pat. No. 5,978,085 supra is placed in a projection imaging tool (PIT). FIG. 6 is a block diagram illustrating portions of an In-Situ Interferometer exposure sequence. FIG. 6 illustrates an illuminator block (ILB) and a projection lens block (PLB). During exposure, an encoded face of an ISI (ISIRF) is illuminated by illuminator block, ILB, and an illuminator modification optic (L) that is part of the ISI. Angular subtense and chief ray direction are modified in a position dependent sense by pinhole (PH) and a projected field (PF) consisting of a multiplicity of projected aberration carrying structures (PMA)—images of which are printed on wafer W during the first exposure. Following the first exposure, reticle blades in ILB (not shown) are adjusted so a single reference structure (MO) is within the exposure area. Wafer, W, is moved by the PIT wafer stage (not shown) to the nominal position of each PMA and exposed creating a projected reference pattern (PMO) overlaying the PMA (FIG. 6). This PMO and PMA combination comprises the projected field point (PFP) which is measured by an overlay tool and the result reconstructed as the projection lens aberrations. The process is described more completely in U.S. Pat. No. 5,978,085 supra and U.S. Pat. No. 5,828,455 supra and U.S. Pat. No. 6,693,390 supra.

Figure 4:
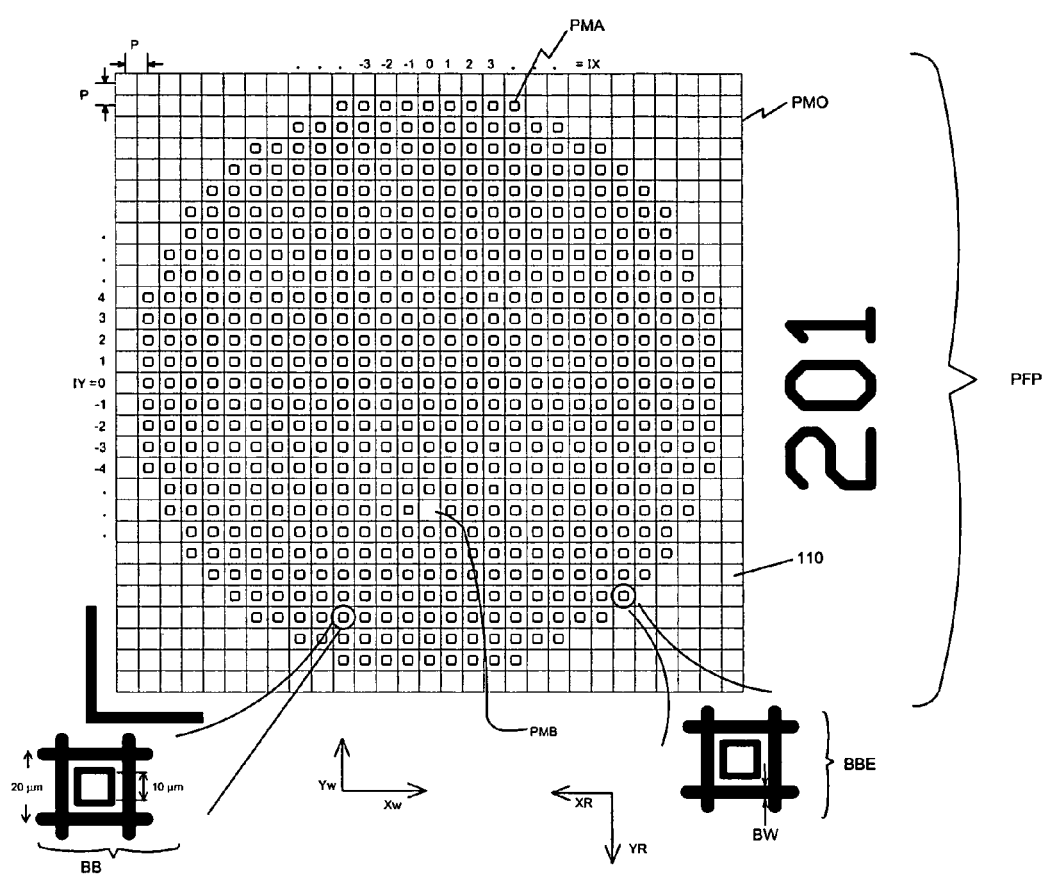
FIG. 4 is a schematic illustrating a projected field point (PFP) at a wafer including an overlay of projected MO pattern (PMO) on a projected MA pattern (PMA).

An embodiment comprises a technique for verifying integrity of overlay data collected from projected field point, PFP. Typically, each PFP contains more than 100 alignment attributes, such as bar-in-bar alignment attributes—each of which is read with an overlay reader. FIG. 4 is a schematic illustrating a projected field point (PFP) at a wafer including an overlay of projected MO pattern (PMO) on a projected MA pattern (PMA). In the example illustrated in FIG. 4, over 400 overlay measurements would be required (~20×20). Each bar-in-bar structure (BB of FIG. 4) typically includes a 20 μm outer square torus of cleared photoresist (drawn as filled in) and a 10 μm inner square torus that are measured with an overlay reader such as a BioRad Q7 see, for example, "Quaestor Q7 Brochure", supra, KLA 5200 Overlay Brochure supra, or other commercial overlay tool (see, for example, KLA-Tencor, "KLA Archer 10 Brochure", www.kla-tencor.com). The precisely measured portion of BB is the offset of the inner square torus from the outer square torus, i.e., $$(BBX, BBY) = (X,Y)_1 - (X,Y)_0 \quad \text{(Equation 1)}$$

where (BBX, BBY)=measured bar-in-bar offset as reported by overlay tool $(X, Y)_1$=position of inner torus $(X, Y)_0$=position of outer torus Overlay reader measurements for a single PFP comprise a series of quadruples ($BBX_i$, $BBY_i$, $XR_i$, $YR_i$,) for i=1:NBB (NBB=number of BB targets per PFP) consisting of the overlay reading at site i ($BBX_1$, $BBY_i$) and the position the reading was taken at in reader coordinates ($XR_i$, $YR_i$). Now if the reader coordinates (XR, YR in FIG. 4) do not coincide or more generally if their relation to wafer coordinates (XW, YW in FIG. 4) has changed from the expected relation, then the wavefront reconstruction results of see, for example, U.S. Pat. No. 5,978,085 supra and U.S. Pat. No. 5,828,455 supra and U.S. Pat. No. 6,693,390 supra will be incorrect (since lens aberrations are a function of field position). Alternatively, another situation that can occur is that the entire PFP array is measured at a shifted position, i.e., instead of the correct quadruple series ($BBX_i$, $BBY_i$, $XR_i$, $YR_i$,) (i=1:NBB) we get ($BBX_i$, $BBY_i$, $XR_i$, +nP, $YR_i$, +mP).

where:
P=pitch or spacing of BB sites on wafer (FIG. 4)
n,m=number of sites in X,Y by which the measurement has been (unintentionally) offset.

This particular overlay reader error (programming problem) leads to an error in pupil centering $\delta \bar{n}$ which then leads to an error in the reconstructed phase $\phi(\bar{n})$ approximately given by:

$$\delta\phi(\bar{n})=\phi(\bar{n}+\delta\bar{n})-\phi(\bar{n})\sim\delta\bar{n}*\nabla_{\bar{n}}\phi(\bar{n}) \quad \text{(Equation 2)}$$

that can be substantial.

Figure 5:
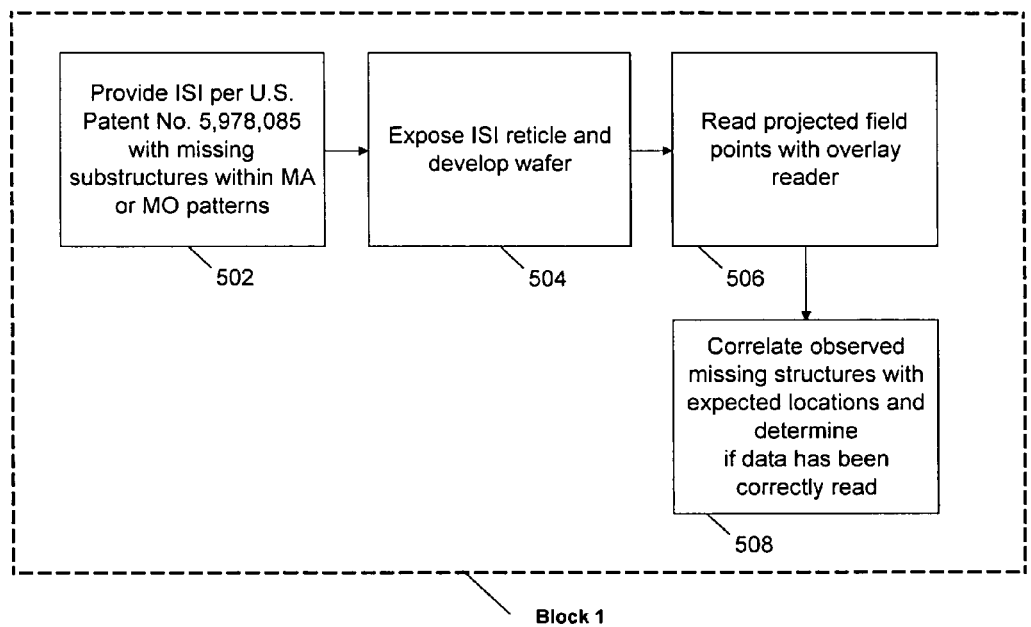
FIG. 5 is a flowchart illustrating a technique for minimizing the frequency of occurrence of overlay ordering errors.

The foregoing technique is aimed at eliminating or at the very least minimizing the frequency of occurrence of these and other overlay ordering errors. FIG. 5 is a flowchart illustrating a technique for minimizing the frequency of occurrence of overlay ordering errors.

Step 1: Provide ISI

Figure 1:
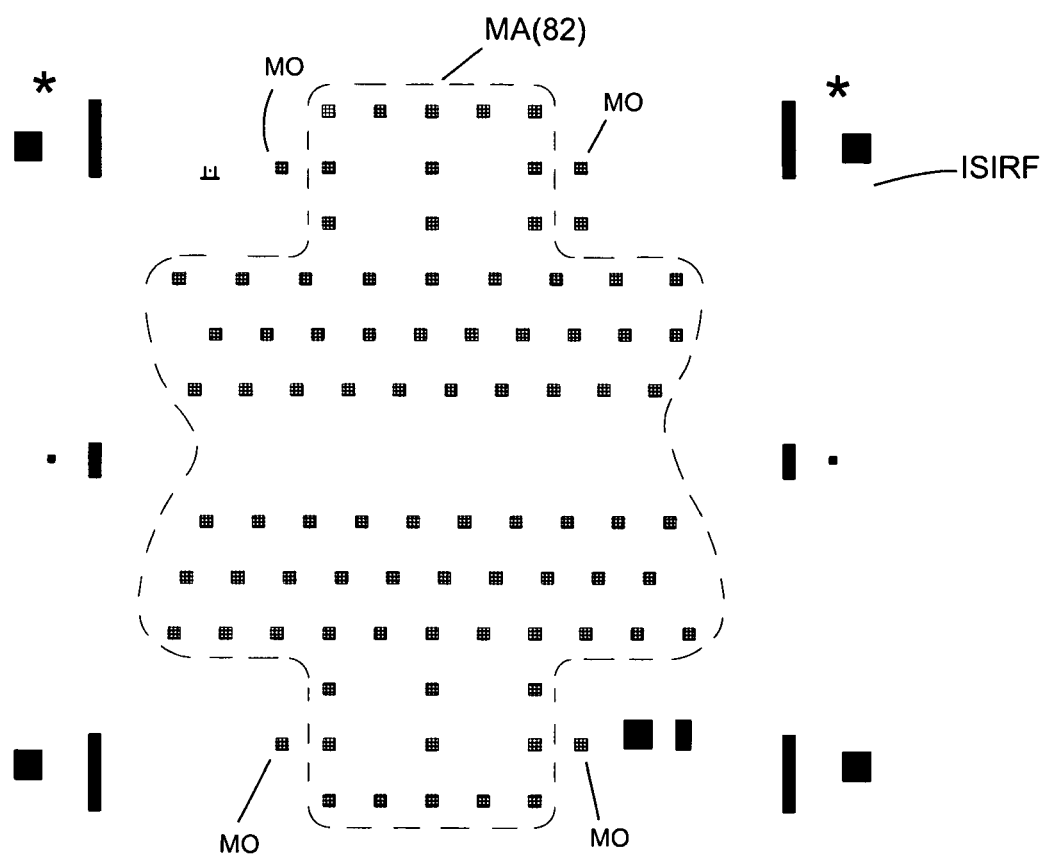
FIG. 1 is a schematic illustrating a plan view of an In-Situ Interferometer Reticle Face (ISIRF) that includes aberration determining structures (MA) and reference structures (MO).
Figure 2:
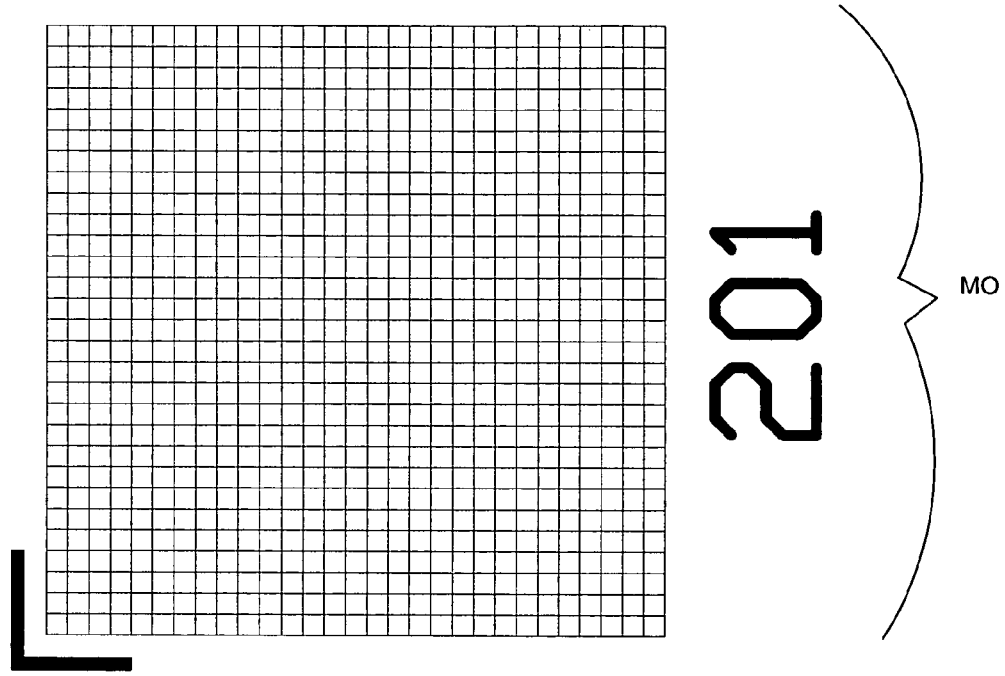
FIG. 2 is a schematic illustrating a plan view of MO structures on an ISIR.
Figure 3:
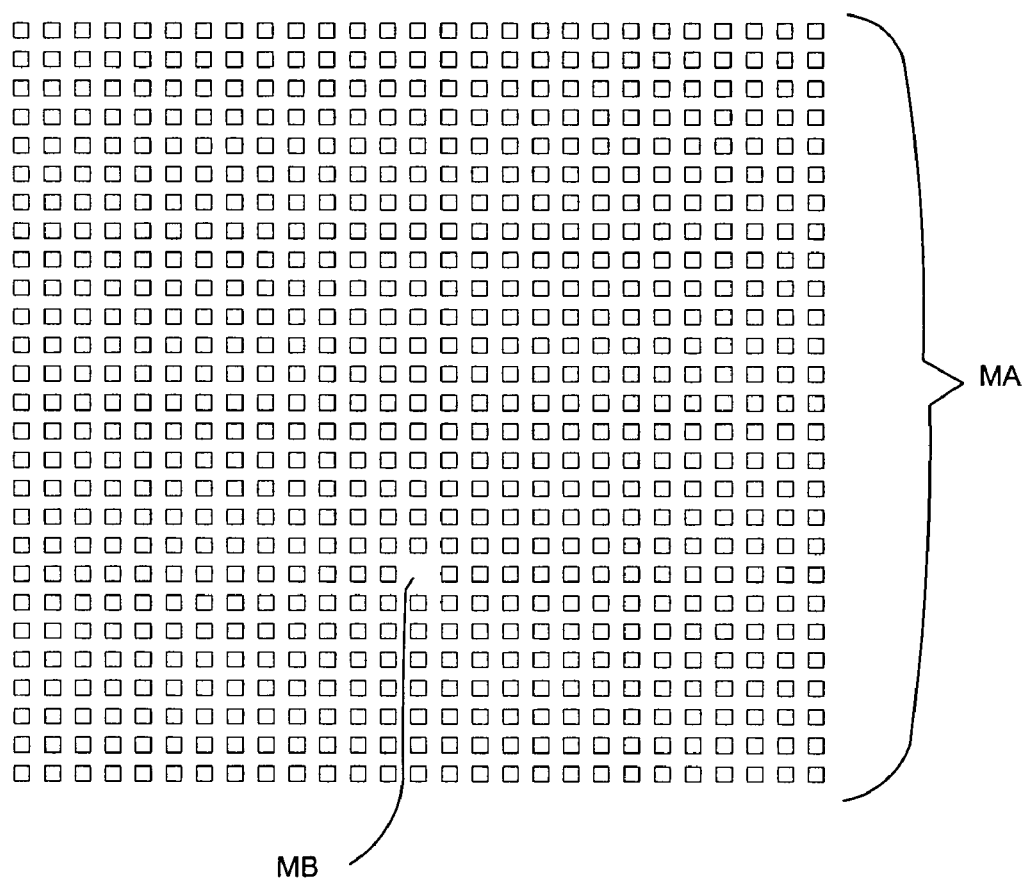
FIG. 3 is a schematic illustrating a plan view of MA structures on an ISIR.
Figure 7:
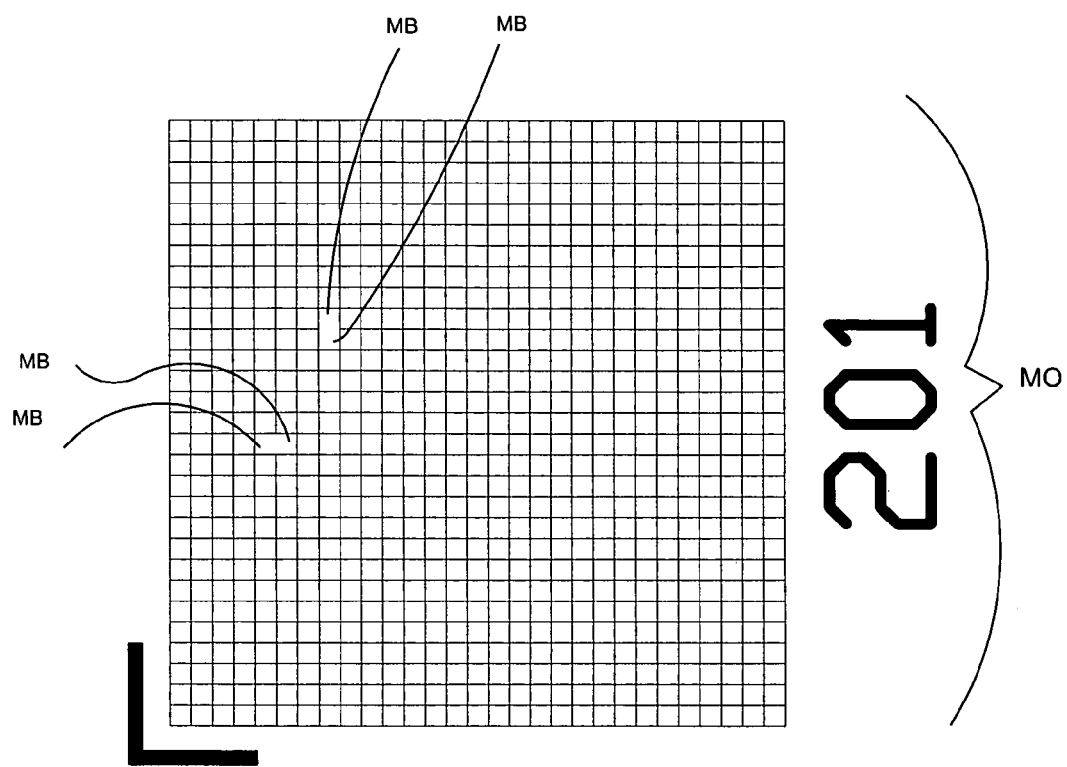
FIG. 7 is a schematic illustrating a plan view of MO structures.

Flow begins in block 502. In block 502 an In-Situ interferometer (ISI, FIG. 6) according to U.S. Pat. No. 5,978,085 supra or U.S. Pat. No. 6,693,390 supra with modified (encoded) MA and MO structures is provided. The modification consists of removing one or more boxes or outer bar structures from the MA or MO structures. FIG. 1 is a schematic illustrating a plan view of an In-Situ Interferometer Reticle Face (ISIRF) that includes aberration determining structures (MA) and reference structures (MO). FIG. 2 is a schematic illustrating a plan view of MO structures on an ISIR. FIG. 3 is a schematic illustrating a plan view of MA structures on an ISIR. The example in FIG. 3 details a 27×27 MA structure where one, square tori with a known position is missing (MB). The example in FIG. 2 details a 29×29 MO structure of outer boxes. In FIG. 3, more than one square tori could be removed, and this will improve the diagnostic effectiveness at the expense of reduced accuracy of the final result (vide infra). Alternatively, or in addition to, MBs can be created on the MO pattern by removing bar segments. FIG. 7 is a schematic illustrating a plan view of MO structures. The example in FIG. 7 shows an MO with four missing boxes obtained by removing two bar segments. Because removing bar segments from an outer box structure creates two side by side missing boxes (MBs) this is not generally preferred because of the reduced accuracy it creates compared to having two separated boxes (vide infra). Thus in cases where the MA consists of outer boxes and the MO of inner boxes (FIG. 4), it would be preferred to selectively remove inner boxes from the MO structure. If the ISI reticle is constructed with a different set of alignment attributes (box-in-box for example, see alignment attributes, see, for example, N. Sullivan, "Semiconductor Pattern Overlay", *Proc. of SPIE, Critical Reviews*, Vol. CR52, pp. 160-188) the inner box (inner substructure MA) could be removed. Additionally, instead of removing the inner bar pattern, in some cases it might be desirable to block out the inner bar pattern completely—forming a bar-in-block pattern. Here, instead of missing MA structures one has a filled-in bar-in-bar structure.

Step 2: Expose and Develop Wafer

Flow continues, in FIG. 5, to block 504. In block 504, an ISI reticle is exposed onto a wafer and the wafer developed. The general method of exposing an ISI being already described (vide supra), we note only that when MA of FIG. 3 and MO of FIG. 2 is projected onto wafer and overlaid by PIT, projected field point pattern PFP of FIG. 4 containing projected missing box, PMB, results.

Step 3: Read Projected Field Points

Flow continues, in FIG. 5, to block 506. In block 506 an overlay reader measures the wafer and provides us with the quintuple array $(BBX_i, BBY_i, XR_i, YR_i, IM_i)$ (i=1:NBB), where;

$IM_i=0/1$ if we could not/could successfully measure the bar-in-bar at site i.

Step 4: Correlate and Assess

Flow then continues to block 508. In block 508, software that uses the understanding of the relation between the reader coordinate system (XR, YR) and the wafer coordinate system (as provided for example by the method of U.S. Pat. No. 6,833,221 supra) can then convert the reported reader coordinate system positions $(XR_i, YR_i)$ into indices $(IX_i, IY_i)$ (FIG. 4) giving the bar-in bar-location relative to the nominal central bar-in-bar (IX=0, IY=0). So at this point we have a seven field array:

$$(BBX_i, BBY_i, XR_i, YR_i, IM_i, IX_i, IY_i)(i=1:NBB).$$

On the other hand, we can construct an array based on our foreknowledge of the scanner NA (and possibly obscuration ratio $\epsilon$), scanner reticle side telecentricity, ISI geometry (especially aperture plate standoff distance and pinhole (PH) diameter), resist exposure conditions, and the known site locations of 'missing teeth' (PMB) using the triplet, $(IXC_i, IYC_i, IMC_i)$ (i=1:NBB) that tells us whether a particular site $(IXC_i, IYC_i)$ should be measurable ($IMC_i=1$) or immeasurable ($IMC_i=0$). For example, in calculating $IMC_i$ we observe the following simple rules; if a bar-in-bar structure is so close to the exit pupil edge so that the calculated intensity relative to the nominal intensity ($I_{nominal}$) on the BB is $\sim 0.2*I_{nominal}$, then we set $IMC_i=0$. In consequence, all sites with missing features (i.e., all PMB sites) have $IMC_i=0$ as do all sites definitely located in regions where no MA should naturally print (e.g., site 110 in FIG. 4). On the other hand, sites that might possibly be read such as edge bar-in-bar structures that are not completely formed (BBE in FIG. 4) are assigned $IMC_i=1$ since it is possible they could be read. Now, and this is an important point, sites with $IMC_i=0$ should not, under any circumstances, be measurable (readable) by an overlay tool. This is because after doing pattern recognition on the outer box, when the gates are set up to measure box offsets there should be substantially zero inner box signal. This condition constitutes a measurement failure at the particular site.

The rule then for assessing whether the data is potentially valid is to compare the two arrays, $IM_i$ and $IMC_i$ (i=1:NBB), and if for any i value we have:

$IM_i=1$(site #i actually measured)

and $IMC_i=0$(site #i not possibly measurable)  (Equation 3)

then the entire overlay data set is invalid and the software should warn the user and terminate wavefront reconstruction operations for this field point.

However, before the software moves onto the reconstruction of the next field point wavefront, we can assess with some level of confidence possible causes so the user can then adjust the measurement program. Regarding IMC as a function of IX and IY (IMC (IX, IY)) we can carry out the test of Equation 3 using:

$$IMC'_i(mx,my)=IMC(IX_i+mx, IY_i+my) \quad \text{(Equation 4)}$$

for an array of integer values mx, my=−2:2 that cover the largest likely potential shifts in the measured data from their expected values. If we pass the test of Equation 3 for some particular mx and my value then we can report this as a likely shift to the user. If we fail all likely shift tests, then expected coordinate systems and actual reader coordinate systems are at variance and we could repeat the above test but with the seven additional cases:

$$IMC'_i(mx,my)=IMC(-IX_i+mx,IY_i,+my)$$

$$IMC(-IX_i+mx,-IY_i+my)$$

$$IMC(IX_i+mx,-IY_i+my)$$

$$IMC(IX_i+mx,IX_i+my)$$

$$IMC(IY_i+mx,IX_i+my)$$

$$IMC(-IY_i+mx,IX_i+my)$$

$$IMC(-IY_i+mx,IX_i+my)$$

$$IMC(-IY_i+mx,IX_i+my)$$

which correspond to permutations of the reader coordinate system (4 directions).

Second Variation of the First Embodiment

Figure 8:
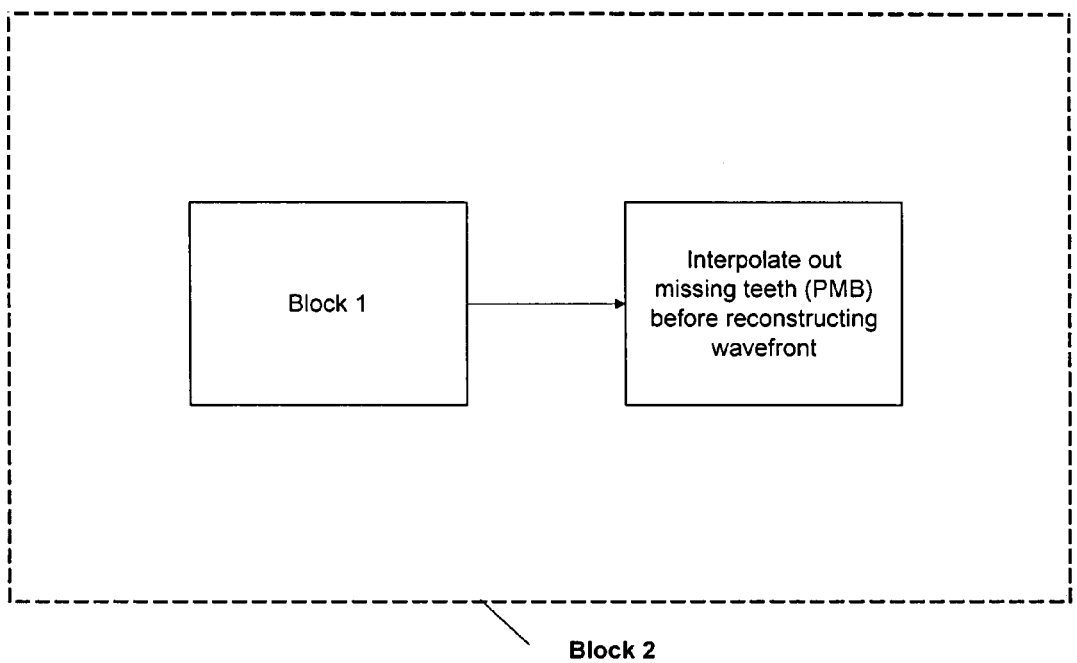
FIG. 8 is a flow chart illustrating another embodiment for minimizing the frequency of occurrence of overlay ordering errors.

FIG. 8 is a flow chart illustrating another embodiment for minimizing the frequency of occurrence of overlay ordering errors. In the example of FIG. 8, in addition to the steps of Block 1 in FIG. 5 the additional step of interpolating out the bar-in-bar data at missing sites (PMB) of FIG. 4 is performed before determining the wavefront aberration—since missing overlay data effects wavefront reconstruction (see, for example, U.S. Pat. No. 5,978,085 supra). This is accomplished by first subtracting any known reticle errors ($BBr_e$) from the spatially neighboring BB measurements and then either linearly interpolating or more preferably using a local bicubic spline. The interpolated value is then fed into the wavefront reconstructor.

Second Embodiment

Non-Coupling Offsets

Figure 9:
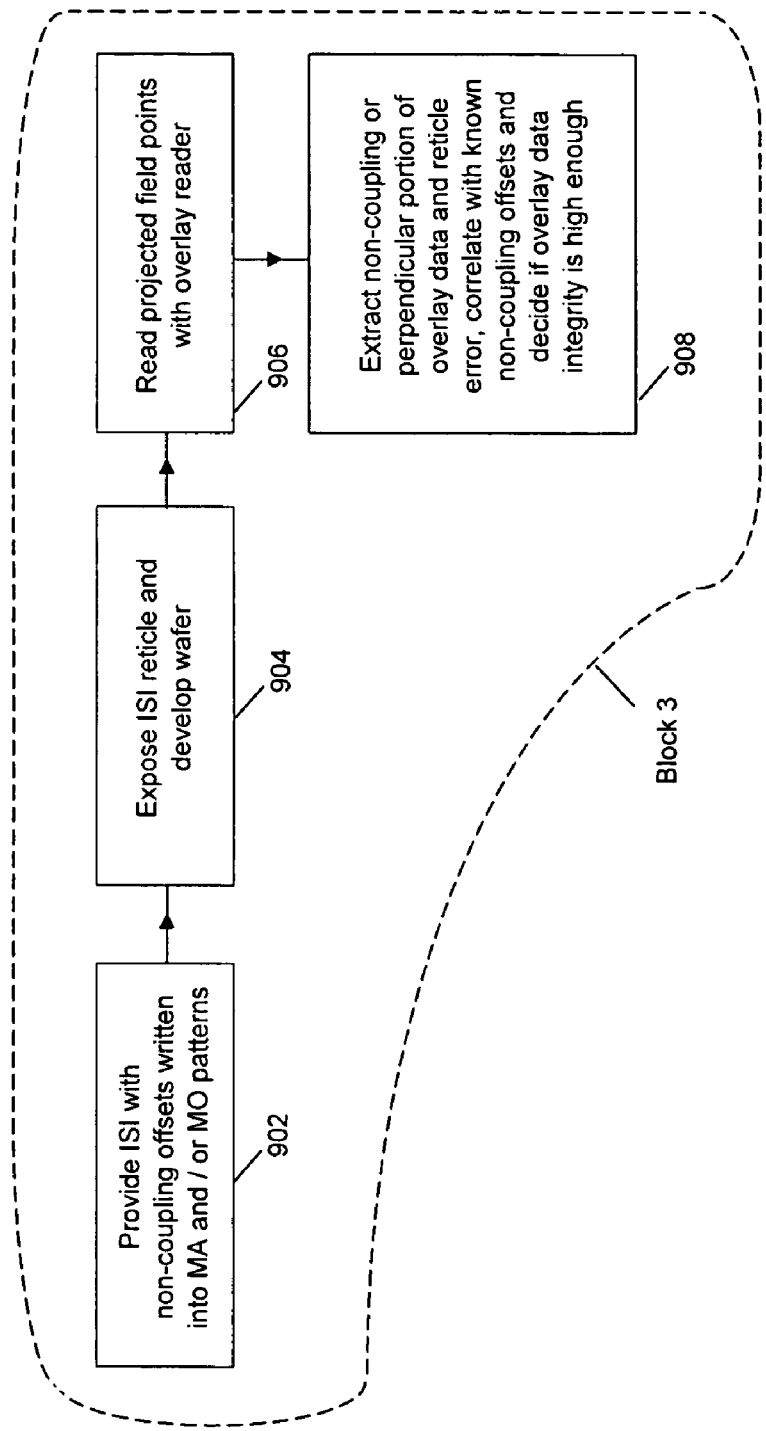
FIG. 9 is a flowchart illustrating an embodiment illustrating the use of non-coupling offsets (NCO).

FIG. 9 is a flowchart illustrating an embodiment illustrating the use of non-coupling offsets (NCO). This embodiment is called the method of non-coupling offsets (NCO).

Step 1: Provide ISI with Non-Coupling Offsets

Flow begins in block 902. In block 902, referring to Block 3, we first provide an ISI with non-coupling offsets (NCO) on either the MAs, the MOs, or possibly both. NCO are pre-calculated offsets of the reticle MA (or MO) positions from their ideal, regularly spaced positions that do not couple to aberrations. Mathematically, if ($BBX_i$, $BBY_i$) are overlay measurements that reconstruct to some set of Zernike coefficients, a(j=1:NZ), then NCO offsets ($BBX_{NCOi}$, $BBY_{NCOi}$) are added to the overlay measurements so the input to our wavefront reconstructor is ($BBX_i+BBX_{NCOi}$, $BBY_i+BBY_{NCOi}$) and the output of our reconstructor will again be the numerically same Zernike aberration coefficients, a (j=1: NZ).

Figure 10:
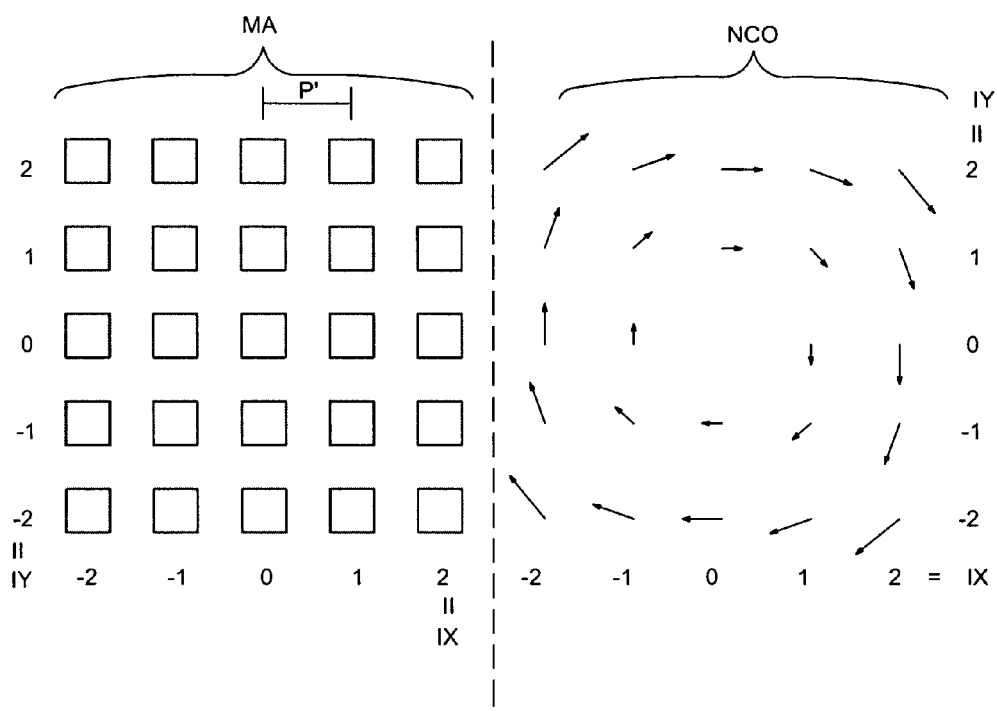
FIG. 10 is a schematic illustrating a portion of an MA pattern and corresponding non-coupling offsets.

FIG. 10 is a schematic illustrating a portion of an MA pattern and corresponding non-coupling offsets. Nominal locations of the individual inner square tori are:

$$(X,Y)(IX,IY)=(X0,Y0)+P'*(IX,IY) \quad \text{(Equation 5)}$$

where:
(X, Y)=position on reticle
(X0, Y0)=nominal position on reticle of center of MA
P'=nominal pitch on wafer
(IX, IY)=spatial indices To the right of MA (FIG. 10) are sample NCO offsets (greatly exaggerated in scale) that represent the additional displacements we intentionally build into the MA pattern. So instead of inner tori positions characterized by Equation 5, we would manufacture the reticle with these positions at:

$$(X,Y)(IX,IY)=(X0,Y0)+P'*(IX,IY)+(DXNCO(IX,IY),$$
$$DYNCO(IX,IY)) \quad \text{(Equation 6)}$$

where:
(DXNCO, DYNCO) (IX, IY)=non-coupling offsets at position IX, IY within MA and the other symbols have the same meaning. The vector pattern in the right half of FIG. 10 represents a particular (DXNCO, DYNCO) (IX, IY) example.

A key to NCO is their property of not contributing to the final Zernike coefficients, a (j=1:NZ), that are output by the wavefront reconstructor. The wavefront reconstruction methods of U.S. Pat. No. 6,693,390 supra, and U.S. Pat. No. 5,828,455 supra and U.S. Pat. No. 5,978,085 supra can be compactly described as one of solving a set of over determined equations for Zernike coefficients aj; the matrix-vector equation is:

$$Da=BB_M+BB_C \quad \text{(Equation 7)}$$

where:
D=2*NBB×NZ (row×column) design matrix (known)
a=NZ Zernike coefficient vector (unknown)
$BB_M$=2*NBB measured bar-in-bar overlay data vector (known)
$BB_C$=2*NBB corrections to bar-in-bar overlay data vector (known)
NZ=# of Zernike coefficients we are solving for (in range 28:81)
NBB=# of overlay data sites measured (in range 100:600)

Overdetermination amount in Equation 7 is:

$$NO=2*NBB-NZ \quad \text{(Equation 8)}$$

since recommended redundancy (U.S. Pat. No. 5,978,085 supra) is NO≧NZ, and we are typically only reconstructing a lower number of Zernikes (28) at lower bar-in-bar counts, the over determination, NO is typically in the range NO=172 to greater than 1000. Now we typically solve Equation 7 by singular value decomposition techniques (see, for example, W. Press et al., "Numerical Recipes, The Art of Scientific Computing", *Cambridge University Press*, pp. 52-64, 1990) so that when we write the solution of Equation 7 as:

$$a=D^{-1}(BB_M+BB_C) \quad \text{(Equation 9)}$$

what we mean by the inverse of the design matrix ($D^{-1}$) is (see, for example, "Numerical Recipes, The Art of Scientific Computing" supra)

$$D^{-1}=V*S^{-1}*U^T \quad \text{(Equation 10)}$$

where:
V=Nz×Nz orthogonal matrix
S='inverse' of singular values, diagonal matrix with at most NZ non-zero diagonal elements
U=2*NBB X 2*NBB orthogonal matrix ($U^T$ is matrix transpose of U)

V, $S^{-1}$, U are all computed by standard SVD algorithms (see, for example, "Numerical Recipes, The Art of Scientific Computing" supra). From the structure of Equation 10 and the meaning of its various components, we can derive the fact that any components of the vector $BB_M+BB_C$ (Equation 9) along the directions given by columns NZ+1:2NBB of matrix U do not contribute to the numerical values, a, computed using Equation 9 and decomposition via Equation 10. So we can explicitly construct a huge range of possible NCOs by setting:

$$DXYNCO_i \sum_{K=N_Z+1}^{2*NBB} W_K * U_{iK} \quad \text{(Equation 11)}$$

where:
 $DXYNCO_i$=NCO offsets expressed in column vector form
 $W_K$=NO=2NBB−NZ arbitrary numbers
 $U_{ik}$=$i^{th}$ row and $k^{th}$ column element of matrix U Requirement 1

Having found a huge class of NCOs we can impose further, practical constraints. First, we do not want the total, measured BB signal to exceed ~1 μm at the wafer since this typically makes setting up the overlay job more difficult and less accurate. Aberrations, by themselves, typically produce BB displacements 2-4× smaller. Therefore the magnitude of the $W_K$s will be restrained so, for example, (Max|BBNCO|)<0.2−0.3 μm.

Requirement 2

Next, because the extent of the bar-in-bar array measured is set by the scanner numerical aperture (NA) (see, for example, U.S. Pat. No. 5,978,085 supra) if we encode an MA or MO with offsets determined from Equation 11 it is preferable that they be of limited spatial extent so that when operating on lower NA scanners, they are still NCO patterns.

Requirement 3

Further, noise sources that cause rapid spatial variation in measured bar-in-bar data from site to site are typically rejected or suppressed in the reconstruction represented by Equation 10; this is because they are largely expressible in the form of Equation 11. Therefore we also desire low spatial frequency patterns for the NCOs.

To satisfy requirements 2 and 3, the first general observation is that bar-in-bar measurements representing aberrations will at least approximately be the gradient of the wavefront $\phi(\bar{n})$ so that:

$$(BBX, BBY)(\bar{n}) \approx \nabla_{\bar{n}} \phi(\bar{n}) \quad \text{(Equation 12)}$$

where:
 $\bar{n}$=transverse direction cosine $$(\nabla)_{\bar{n}} = \left( \frac{\partial}{\partial nx}, \frac{\partial}{\partial ny} \right) \text{ the gradient operator.}$$

Next, since a general 2-d vector field (VX, VY) (nx, ny) can be generally decomposed into a 'gradient' and curl part as:

$$(VX, VY)(nx, ny) = \left( \frac{\partial}{\partial nx}, \frac{\partial}{\partial ny} \right) \varphi + \left( \frac{\partial}{\partial ny}, \frac{-\partial}{\partial nx} \right) A \quad \text{(Equation 13)}$$

then a starting candidate for NCO will be:

$$(DXNCO', DYNCO')(nx, ny) = \left( \frac{\partial A}{\partial ny}, \frac{-\partial A}{\partial nx} \right) \quad \text{(Equation 14)}$$

for an arbitrary function A (nx, ny). At this point, we can approximately enforce requirements 2 and 3 (limited spatial extent and smoothness) by proper choice of scalar function A in Equation 14. To make a candidate NCO (Equation 14) truly non-contributing, we simply project out those components that are in the first NZ columns of U. So if $DXYNCO'_i$ is the appropriate NCO from Equation 14 then we get a true NCO, $DXYNCO_i$, by applying the following formula:

$$DXYNCO_i = DXYNCO'_i - \sum_{K=1}^{NZ} W'_K U_{iK} \quad \text{(Equation 15)}$$

where $$W'_K = \sum_{i=1}^{2*NBB} DXYNCO'_i * U_{ik} \quad \text{(Equation 16)}$$

To satisfy requirement 1, we simply scale the results from Equations 15 and 16.

Step 2: Expose ISI and Develop Wafer

Flow continues, in FIG. 9, to block 904. In block 904, the ISI is exposed and the wafer developed in accordance with U.S. Pat. No. 5,828,455 supra or U.S. Pat. No. 5,978,085 supra.

Step 3: Read Projected Field Points

Flow continues to block 906. In block 906, the projected field points are read with an overlay reader in accordance with U.S. Pat. No. 5,978,085 supra or U.S. Pat. No. 6,833,221 supra.

Step 4: Extract Non-Coupling Portion and Verify Overlay Data Integrity

Flow then continues to block 908. In block 908, where having encoded the reticle to include known offsets that do not couple into the aberrations, we are now in a position to use that information. The reason for encoding these pre-determined shifts onto the MA and MOs is to verify the integrity of the overlay data. The measured overlay data ($BBM_i$, i=1:2*NBB) includes the effects of aberrations, reticle errors (possibly measured and known), noise, and the NCO offsets as:

$$BBM_i = BBA_i + BBN_i + BBRE_i + BBNCO_i \, i=1:2*NBB \quad \text{(Equation 17)}$$

where:
 $BBA_i$=aberration contribution to bar-in-bar measurements
 $BBN_i$=noise contribution to bar-in-bar measurements
 $BBRE_i$=reticle fabrication error to bar-in-bar measurements
 $BBNCO_i$=NCO contribution to bar-in-bar measurements To the extent we have previously measured the reticle and know, at least partially, the reticle fabrication errors we can subtract them out to get:

$$BBM_i - BBRE''_i = BBA_i + BBN_i + (BBRE_i - BBRE''_i) + BBN\text{-}CO_i \quad \text{(Equation 18)}$$

If we now project out the aberration parts by applying Equations 15 and 16 to the numerical values $BBM_i - BBRE''_i$ then Equation 18 becomes $$(BBM_i - BBRE''_i)^\perp = BBN_i^\perp + (BBRE_i - BBRE''_i)^\perp + BBN\text{-}CO_i \quad \text{(Equation 19)}$$

where:

$\perp$ denotes the portion of the relevant quantity perpendicular to the aberration contributions (i.e., the portion remaining when Equations 15 and 16 are applied), and $BBNCO_i = BBNCO_i^\perp$ by the nature of its construction. So to the extent that our encoded NCO offsets are larger than the residual noise ($BBN^\perp$) or the unknown portion of the reticle error ($BBRE-BBRE''$), we can do a useful correlation of ($BBM-BBRE''$)$^\perp$ (known) with BBNCO (known). This correlation score, if it is high enough, indicates fidelity in the gathered overlay data. To the extent that the score is indeterminate, and we cannot decide if the overlay data is acceptable or not, at least the NCO encoding will not adversely impact any reconstruction results.

Second Variation of Second Embodiment

Non-Coupling Offsets with Global NCO Adjustments

Figure 14:
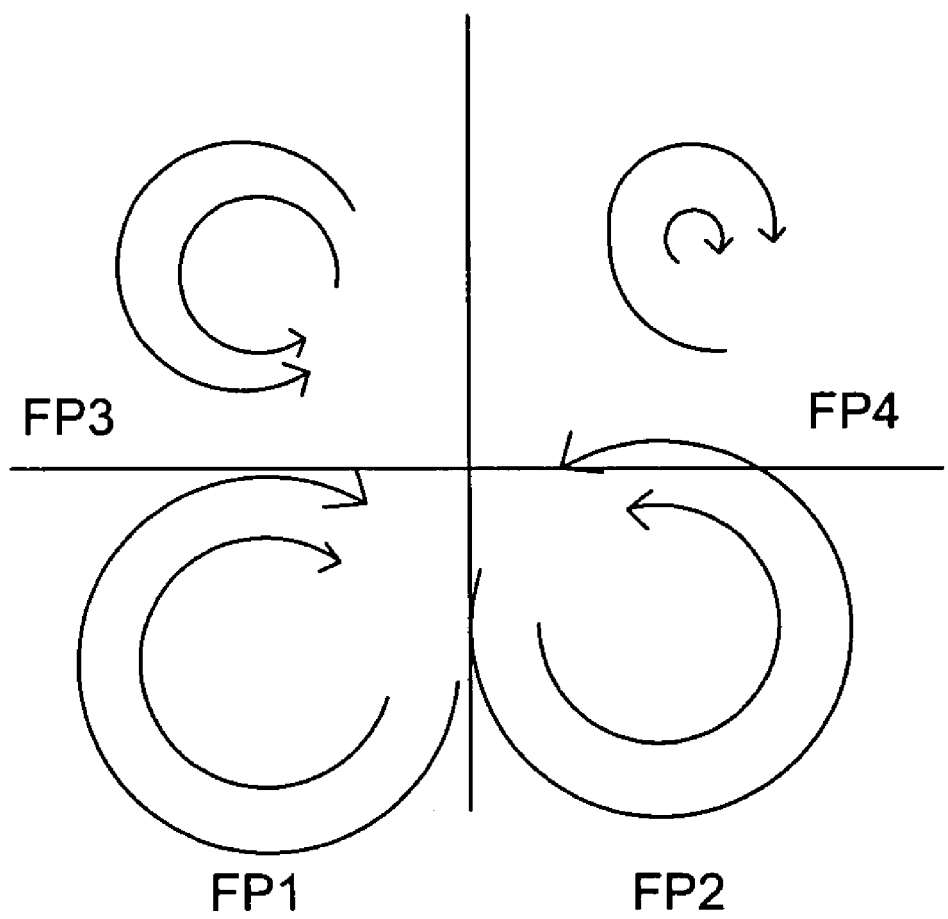
FIG. 14 is a schematic illustrating curl patterns of varying magnitude and direction are shown at four separate field points (FP1 through FP4).

While the second embodiment detailed NCO patterns on a local level for each field point using possibly a curl pattern (FIG. 10) for each field point the second variation of the second embodiment adds or superimposes a global pattern across the reticle field consisting of say ~25 field points or 25 groups of MA and MO patterns (the number or MA patterns depends on the ISI reticle design per U.S. Pat. No. 5,978,085 supra). This just means that in addition to having identical curl type patterns for each MA field point (FIG. 10) one can also modify each curl pattern to give a global relationship as well as a local relationship (FIG. 14). FIG. 14 is a schematic illustrating curl patterns of varying magnitude and direction are shown at four separate field points (FP1 through FP4). For example, one might simply add a constant value (DXY) to each NCO field point vector (DXNCO, DYNCO) (IX, IY) or (DXNCO+DXY, DYNCO+DXY) (IX, Y) (keeping within the offset constraints mentioned above). Alternatively, labeling each (MA) field point on the reticle from 1:i (equal to the number or MA patterns on the ISI reticle) we simply increase the magnitude of each curl pattern slightly. Many other variations of this are possible using Equation 11 above. Additional encoding leads to better statistics for determining if the overlay job was read correctly in the presence of various noise sources (vide supra) since the sampling includes an additional fixed relationship between each doubly encoded MA structure.

Third Variation of the Second Main Embodiment

Telecentricity

Figure 11:
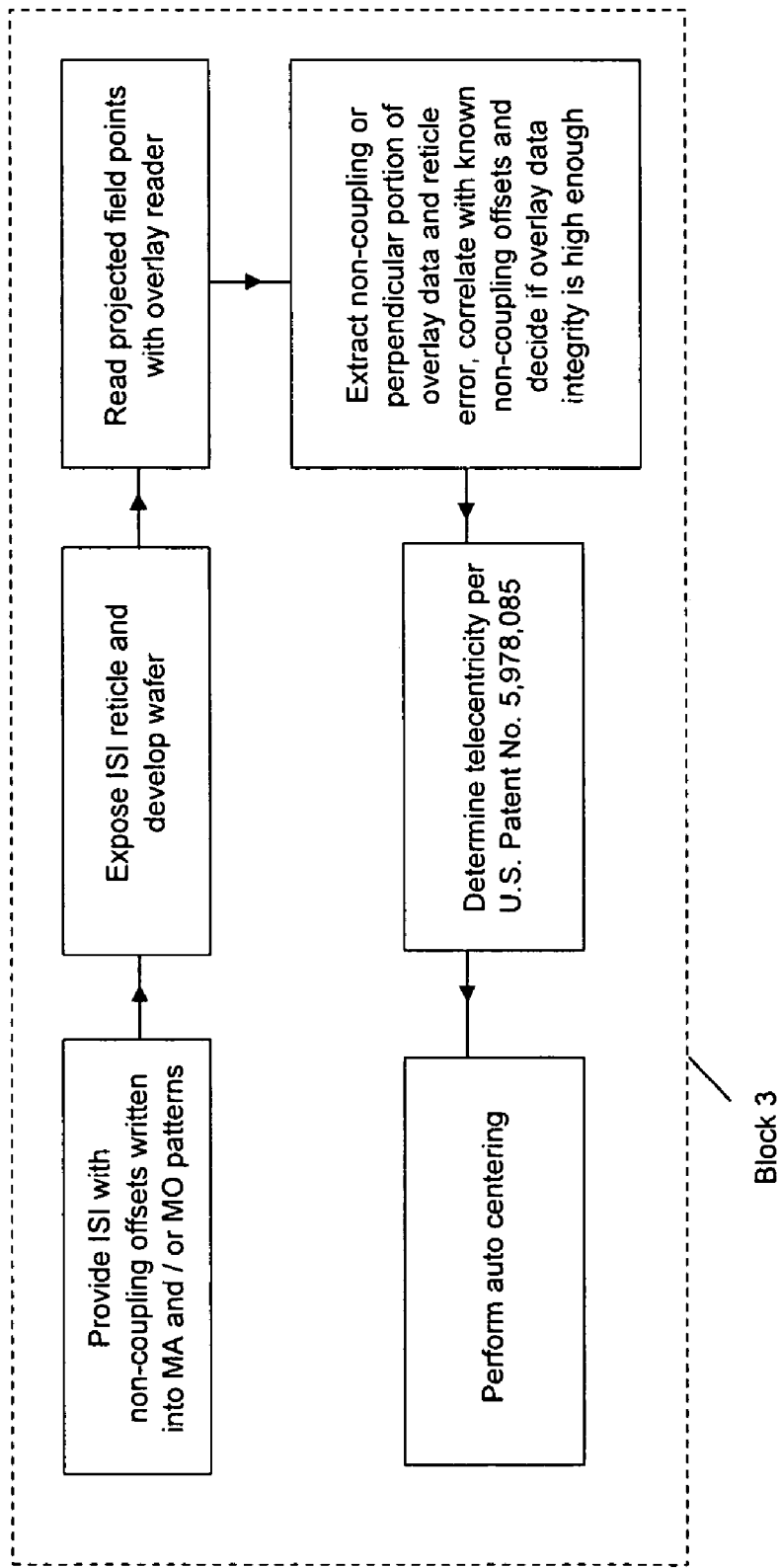
FIG. 11 is a flow chart illustrating steps of another embodiment of general local and global patterns for embedded encoding using orthogonal functions.
Figure 12:
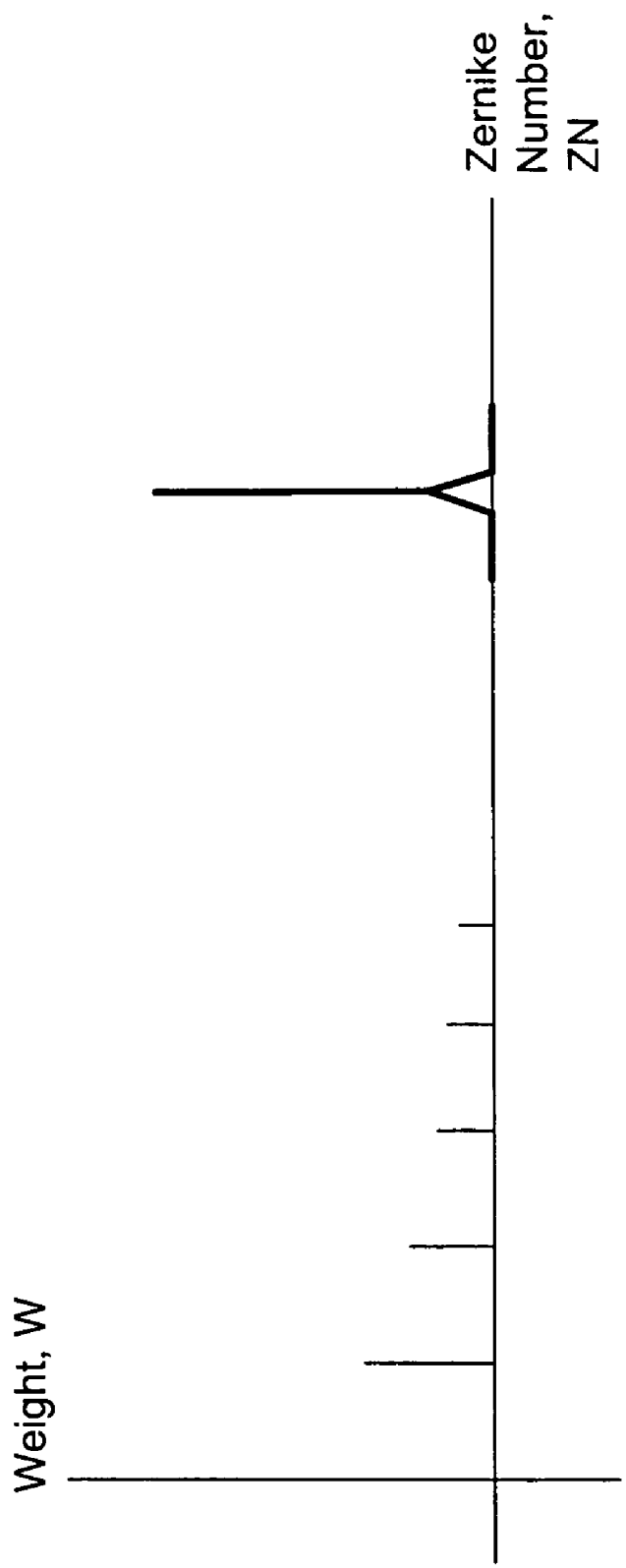
FIG. 12 is a chart illustrating an exemplary Zernike spectrum for automatic pupil centering.

FIG. 11 is a flow chart illustrating steps of another embodiment of general local and global patterns for embedded encoding using orthogonal functions. So far, the non-coupling form of embedded encoding has been described as shifting the position of MO (or MA) structure an amount determined by the orthogonally conditions described above. It is also possible to shift the entire (field point) pattern in the pupil a given amount by programming fixed pupil offsets into the reticle patterns during exposure (MA or MO patterns). This follows from U.S. Pat. No. 5,978,085 supra where methods for determining wafer-side telecentricity are described. Here each group of MA (or MO) reticle features (FIG. 6) would be shifted by a predetermined amount and can be subtracted before or after Zernike reconstruction to check the overlay reader job integrity as described above for non-coupled offsets. Additionally, since the methods described in U.S. Pat. No. 5,978,085 supra can be performed with the same reticle as the ISI it is also possible to perform both wavefront (Zernike) reconstruction and wafer side telecentricity using embedded encoding since the non-coupling (telecentricity) offsets would be added to any machine specific pupil centering error and can be subtracted out before or after Zernike and telecentricity reconstruction. In general since each machine has a unique wavefront (and telecentricity) the reconstructed Zernike spectrum can be used to filter or identify a specific machine once the overlay job has been verified. Once calculated, future telecentricity error would indicate faulty overlay job programming or shifts in pupil centering. FIG. 12 is a chart illustrating an exemplary Zernike spectrum for automatic pupil centering.

Additional Variations for the Second Main Embodiment Using NCO Adjustments

While FIG. 11 outlines the general local and global patterns for embedded encoding using orthogonal functions that have been described above, it should be mentioned since the Zernike coefficients are themselves orthogonal additional methods for embedded encoding, include embedding the reticle with a particular Zernike term or Zernike set. Here then the embedded reticle overlay targets for each field point are miss-placed using distances determined by the embedded or added Zernike term (and known optics of the ISI reticle and optical system). For example in the case of Z4 or lithographers focus, the offsets would be displaced according to Equation 20.

$$\text{Encoded offsets due to Z4 embedding} = (BBX, BBY)(\vec{n}) \approx \nabla_{\vec{n}} \phi_{Z4}(\vec{n}) \quad \text{(Equation 20)}$$

Then, as described in the second embodiment, reconstruction can take place without interference from the embedding if the overlay reader data produces the desired output as described above (using a statistical correlation score).

Figure 13:
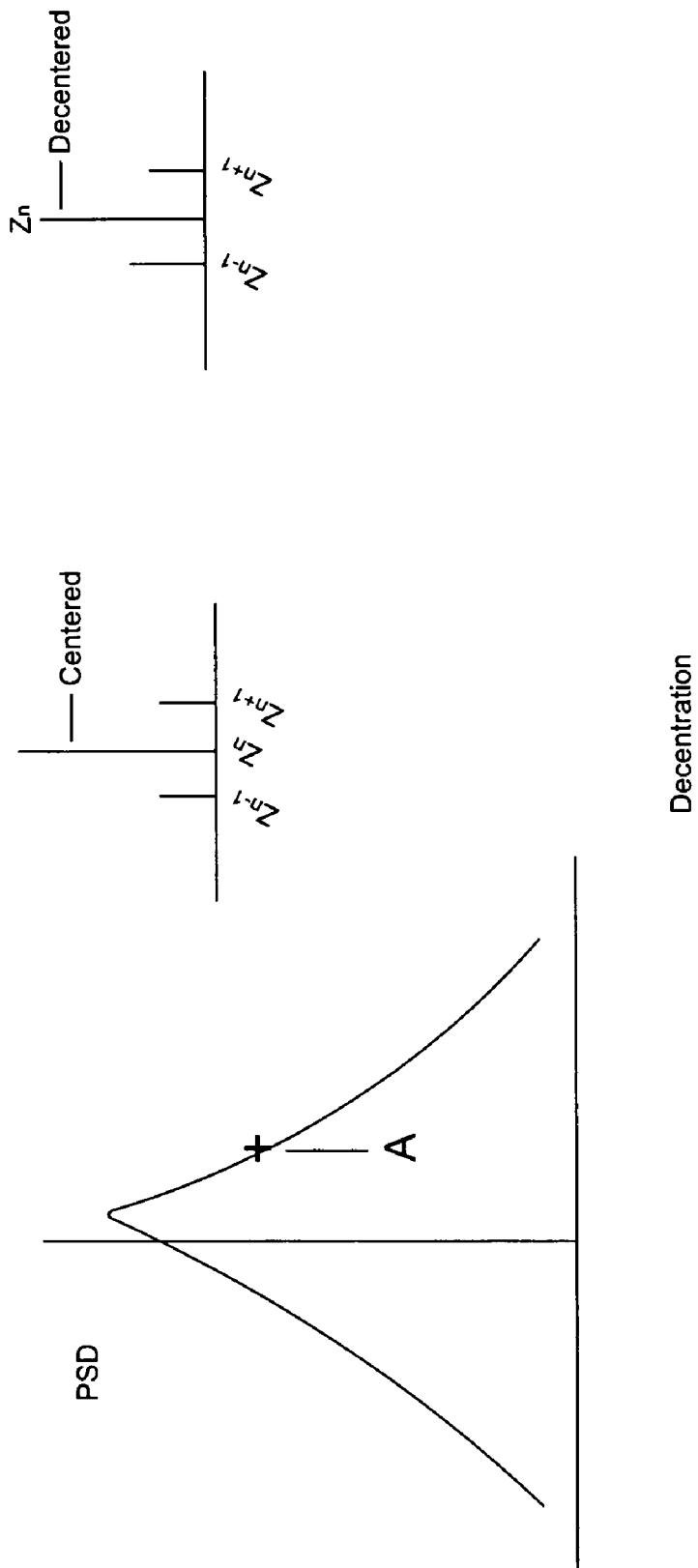
FIG. 13 is a diagram illustrating exemplary Zernike power spectrum plots.

Additionally, if the ISI method (see, for example, U.S. Pat. No. 5,978,085 supra) and Zernike solver is good enough to extract 80 Zernike terms and only 60 terms are required for proper wavefront reconstruction, one could use the extra 20 Zernikes for encoding by adjusting the reticle offsets of the MA or MO patterns as described above. In this case-one has an encoded wavefront with a portion of the Zernike spectrum programmed in. The wavefront (for each field point) can then be reconstructed (without subtracting-out the programmed portion of the Zernike spectrum) and the results plotted as a Zernike power spectrum. FIG. 13 is a diagram illustrating exemplary Zernike power spectrum plots. Pieces missing from the expected reconstruction or spectrum indicate that the overlay job was corrupt. If the known encoding is removed before wavefront reconstruction, the reconstruction will have a certain (Zernike) spectrum of residuals and incorrect ordering will show up as a change in the noise level in the data set.

Third Embodiment

Alignment Attribute CD Width Adjustments

If the overlay reader is equipped with an optical CD measurement tool it is also possible to encode an ISI reticle by modification of the physical size (width) of the alignment attribute instead of removing MA or MO structures as describe in the first embodiment. For example in the case of a bar-in-bar pattern one can simply change the bar-width, BW, (not length) of an alignment attribute substructure from say 1 um to 2 um (see BW FIG. 4) for select MA patterns. The benefit of this technique is that it is independent of overlay measurement (as long as the signal to noise ratio is not affected on the read out signal) and does not require interpolation to reconstruct the aberration wavefront (see above); however, it does take more time to process a wafer using CD measurements. The process is the same as described in FIG. 5 except here we use modified bar-in-bar substructures (increase in the physical thickness of a bar for example) and the correlation portion entails interpreting the CD data feature to feature as opposed to missing MA or MO patterns.

Further Embodiments

While construction for the second embodiment so far has been formulated to perform embedding using the ISI reticle (see, for example, U.S. Pat. No. 5,828,455 supra and U.S. Pat. No. 5,978,085 supra) for wavefront reconstruction it is also possible to perform embedding for other methodologies where the integrity of overlay data is critical for analysis and extra or separate measurements are performed at high cost. For example, methods such as those sited in see, for example, Smith et al., "Method and Apparatus for Self-Referenced Projection Lens Distortion Mapping", U.S. Pat. No. 6,573,986, Jun. 2, 2003, Smith "Method and Apparatus for Self-Referenced Dynamic Step and Scan Intra-Field Scanning Distortion", U.S. Pat. No. 6,906,303, Jun. 14, 2005, and Smith "Method and Apparatus for Self-Referenced Dynamic Step and Scan Intra-Field Lens Distortion", U.S. Pat. No. 6,906,780, Jun. 14, 2005, and Smith, "Apparatus and Process for Determination of Dynamic Lens Field Curvature", U.S. Publication No. 2005/0243309, Nov. 3, 2005 would be prime candidates since each method requires reading in overlay data in a correct sequence and reconstructing the said data to obtain a lens or scanner distortion map similar to the ISI. Here for these cases however, since reconstruction does not rely on Zernike coefficients (orthogonal systems) the method presented in the first embodiment would be preferred. Finally, other methods for verifying the integrity of the overlay reader job such as a reference array method described in U.S. Pat. No. 5,978,085 supra are also candidates for embedded encoding since again, the overlay data must be processed in an exact order with high data integrity.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

We claim:

1. A method of embedded encoding of overlay data ordering, the method comprising:
    exposing a reticle pattern in a first position onto a substrate with a recording media, the reticle comprising a plurality of separate and distinguishable alignment attributes, wherein a desired number of the alignment attributes at desired locations are shifted with non-coupling offsets;
    measuring the exposed reticle pattern;
    determining non-coupled portion of the overlay data and reticle error; and
    correlating known overlay data with known non-coupling offsets to determine a statistical integrity.

2. A method as defined in claim 1, further comprising determining if the statistical integrity is above a threshold.

3. A method as defined in claim 1, wherein the non-coupled offsets are derived from shifts representing pupil decentering.

4. A method as defined in claim 1, wherein the non-coupled offsets are derived from shifts representing telecentricity.

5. A method as defined in claim 1, wherein the non-coupled offsets comprise one or more vortices.

6. A method as defined in claim 1, further comprising reconstructing a wavefront.

7. A method as defined in claim 1, further comprising reconstruction of a wafer-side telecentricity.

\* \* \* \* \*